United States Patent
Jarrige et al.

(10) Patent No.: US 10,156,465 B2
(45) Date of Patent: Dec. 18, 2018

(54) METHOD FOR DETECTING ANOMALIES IN A DISTRIBUTION NETWORK, IN PARTICULAR A WATER DISTRIBUTION NETWORK

(71) Applicant: SUEZ GROUPE, Paris la Defense (FR)

(72) Inventors: Pierre-Antoine Jarrige, Montesson (FR); Guillaume Gancel, Yvrac (FR); Francis Campan, Antony (FR)

(73) Assignee: SUEZ GROUPE, Paris la Defense (FR)

( * ) Notice: Subject to any disclaimer, the term of this patent is extended or adjusted under 35 U.S.C. 154(b) by 0 days.

(21) Appl. No.: 15/328,515

(22) PCT Filed: Jul. 23, 2015

(86) PCT No.: PCT/IB2015/055581
§ 371 (c)(1),
(2) Date: Jan. 24, 2017

(87) PCT Pub. No.: WO2016/012971
PCT Pub. Date: Jan. 28, 2016

(65) Prior Publication Data
US 2017/0205267 A1    Jul. 20, 2017

(30) Foreign Application Priority Data

Jul. 25, 2014  (FR) ..................................... 14 57222

(51) Int. Cl.
*G01F 15/06*    (2006.01)
*G05B 23/02*    (2006.01)
(Continued)

(52) U.S. Cl.
CPC .......... *G01F 15/068* (2013.01); *G01L 19/083* (2013.01); *G05B 23/0243* (2013.01); *G06F 17/5009* (2013.01)

(58) Field of Classification Search
CPC ... G01F 15/068; G01L 19/083; G06F 17/5009
See application file for complete search history.

(56) References Cited

U.S. PATENT DOCUMENTS 4,361,030 A * 11/1982 Heide ................. G01M 3/2807
                                                  73/40.5 R
4,712,182 A * 12/1987 Wakamori .......... G01M 3/2807
                                                  702/36
(Continued)

FOREIGN PATENT DOCUMENTS

FR          2 957 097 A1     9/2011

OTHER PUBLICATIONS

Written Opinion issued in International Application No. PCT/IB2015/05581 dated Jan. 31, 2017 with English translation.
(Continued)

*Primary Examiner* — Elias Desta
(74) *Attorney, Agent, or Firm* — Young & Thompson (57) ABSTRACT

A hydraulic model of the network is used that describes the structural data and the laws governing the distributed flows. The model is fed with operational data relative to primary input parameters and, using the model, theoretical values are obtained for primary output parameters. The theoretical values are compared with measured values. In case of a significant deviation, the corresponding primary output parameter becomes a secondary input parameter in an inverse model including new secondary output parameters, which are added relative to the direct model and which correspond to primary input parameters. The secondary output parameters are, by priority, those to which the primary output parameter exhibiting the abnormal value is
(Continued)

particularly sensitive. If necessary, the method is implemented iteratively by progressively restricting the number of the secondary output parameters.

20 Claims, 2 Drawing Sheets (51) Int. Cl.
*G01L 19/08* (2006.01)
*G06F 17/50* (2006.01)

(56) References Cited

U.S. PATENT DOCUMENTS

| | | | |
|---|---|---|---|
| 6,336,131 B1* | 1/2002 | Wolfe | G06F 17/30861 709/203 |
| 7,920,983 B1* | 4/2011 | Peleg | G01M 3/2807 137/1 |
| 2003/0208287 A1 | 11/2003 | Kurz et al. | |
| 2014/0107964 A1 | 4/2014 | Song et al. | |

OTHER PUBLICATIONS

International Search Report, dated Nov. 18, 2015, from corresponding PCT application.

* cited by examiner

FIG. 1

METHOD FOR DETECTING ANOMALIES IN A DISTRIBUTION NETWORK, IN PARTICULAR A WATER DISTRIBUTION NETWORK

BACKGROUND OF THE INVENTION

Field of the Invention

The present invention relates to a method for detecting anomalies in a fluid supply system, in particular a network distributing newtonian fluids, even more particularly for water distribution, but also for example in urban heating and/or air conditioning networks.

Description of the Related Art

The operational performance is at the center of the management of such networks. The level of performance can be substantially improved using tools for detecting and locating hydraulic anomalies, for example on the drinking water transport and distribution networks.

In such networks, different types of incidents can occur and have serious consequences for the operator. They can be leaks, interruptions of supply to the consumers, component operating faults, handling errors in an intervention or following an intervention, malicious action, abnormal behaviour or malfunction in the home of a consumer.

In very extended and partially inaccessible (buried) networks, direct surveillance is ineffective or often impossible. Nor is surveillance by measuring instruments sufficient, because a local anomaly can have effects on a wide area of the network or even on the entire network, which complicates the diagnostics.

Detection methods are known that are based on statistical techniques. They do not make it possible to characterize either or locate the anomaly.

Other known detection methods are based on hydraulic models using evolutionary algorithms (genetic algorithms) to detect and/or locate anomalies. These evolutionary methods are highly intensive in terms of computation resources, which makes them difficult to apply on a large scale.

BRIEF SUMMARY OF THE INVENTION

The aim of the present invention is to propose an effective method for detecting and/or locating and/or characterizing and/or quantifying an anomaly in a distribution network that can, as appropriate, be vast, as in a drinking water distribution network.

According to the invention, the method for detecting anomalies in a distribution network comprises:
  the establishment, for the network, of a direct model comprising the following elements:
    structural data of the network,
    operational data relative to parameters chosen as primary input parameters describing an operational scenario,
    laws linking said structural data, the primary input parameters and primary output parameters (simulating the model);
  the execution of the direct model to determine theoretical values of the primary output parameters (resolving the inverse problem);
  the obtaining of measurements of the primary output parameters;
  the comparison of the theoretical values and of the measurements;
  in the case where the comparison reveals at least one primary output parameter that is abnormal because of a significant deviation between theoretical value and measurement, the establishment of an inverse model which is derived from the direct model by introducing the at least one abnormal primary output parameter as a secondary input parameter of the inverse model, the inverse model also comprising at least one secondary output parameter in addition to the primary output parameters retained;
  the execution of the inverse model.

Preferably, the distribution network is a fluid distribution network.

The establishment of the inverse model can comprise a minimization of a function of deviation between measurement and simulation at the measurement point, relative to a configurable set of parameters.

The secondary input parameter can take the measurement value as value.

The execution of the inverse model is preferably performed by the hydraulic simulation engine.

The resolving of the inverse problem can implement a numerical algorithm of minimization of the deviation between theoretical and measured outputs also using the calculation in the direct model of the sensitivities of the outputs relative to the inputs.

The structural data are typically relative to the topography of the network, to the nature and to the characteristics of its components, etc.

"Primary input parameter" denotes an operating parameter. The operating parameters are typically variables in time. For example, in a water distribution network, a flow rate, a pressure, etc., of which the value is used as input datum for the direct model. This value can be supplied by a measuring instrument or be known in another manner such as, for example, a consumption statistic as a function of the date and time. In general, the primary input parameters comprise parameters descriptive of the conditions at the limits of the network. For example, in a hydraulic network, the supply flow rate of the network and the flow rates supplied to the consumers.

Generally, the adjective "primary" means "relative to the direct model" whereas the adjective "secondary" will mean "relative to the inverse model".

A "scenario" is a case of operation of the network. For example, in a hydraulic network, the scenario begins with a certain level of filling in a supply tank, and, as the scenario progresses, the tank is resupplied with a certain flow rate while it supplies water to the network as a function of the flow rates taken at the consumption points. The different flow rates change according to respective timing diagrams which form part of the scenario.

The laws are in particular the laws of the applicable physics. For example, in a hydraulic network, the loss of head (pressure drop) between two points of the network as a function of the rate of flow and of the structural data of the network between the two points.

The "primary output parameters" are parameters that can be calculated by execution of the direct model to obtain their theoretical value, and which are at the same time measurable using the instrumentation of the network which provides a measurement of each of the primary output parameters, or known for example from prior statistics.

In the method according to the invention, the theoretical value and the real value of the primary output parameters are compared and it is considered that there is an anomaly in the network if there is a discrepancy between the theoretical and measured values.

When a primary output parameter is "abnormal" in as much as there is, between its theoretical and measurement values, a deviation exceeding an acceptable error margin, an inverse model is resolved (executed) for which the abnormal primary output parameter becomes a secondary input parameter to which the measurement value is given as value. In particular for the inverse model to have the necessary mathematical degrees of freedom, at least one additional variable is introduced into the inverse model that comprises a new secondary output parameter. Preferably, these new secondary output parameters are chosen shrewdly as a function of the result anomaly from the comparison with the measurements following the execution of the direct model.

The execution of the inverse model provides results which are either directly informative, for example the new output parameters have a theoretical value which makes it possible to identify the anomaly with a sufficient certainty, or make it possible to converge towards such an identification iteratively as will be explained hereinbelow.

Thus, the invention finely exploits the consistency of all the variables (operating parameters) linked by the "laws", typically the equations of behaviour of the network, in particular hydraulic.

The at least one secondary output parameter can be a parameter added to the hydraulic model, relative to the direct model.

For example, if a leak is suspected at a point of the network, a leak flow rate can be added as secondary output parameter that is to be determined using the inverse model.

The at least one secondary output parameter can also correspond to at least one deleted datum, relative to the direct model. For example, if a primary input parameter indicates a valve in open position, but the anomaly revealed by the deviation between the theoretical value and the measured value for at least one primary input parameter suggests that this valve could be closed or partially closed, the primary input parameter in question is chosen as secondary output parameter, and deleted from the input parameters for the execution of the inverse model.

In a preferred embodiment, the at least one secondary output parameter is selected by applying at least one criterion revealing the likelihood that the at least one new secondary output parameter is implicated in the deviations observed between measurements and theoretical values.

Looking again at the preceding example, a measured flow rate value which is abnormal relative to the theoretical value at a given point of the network for example makes it likely either that a valve which was considered open is closed, or that there is a significant leak, or that there is an abnormal counter-current flow rate downstream (nonlimiting list).

According to a very preferential particular feature of the invention, at least some of the operational data, theoretical values and measurements comprise temporal series, that is to say series of values each associated with a schedule.

Thus, the direct model and the inverse model are worked not only statically, but also dynamically. This makes it possible for the model to conduct additional consistency checks. For example, the model can comprise a law which links the variation of the level of a tank to a sum of flow rates measured at different points of the network. In case of anomaly, not only is the value of the deviation at an instant of operation obtained, but also a deviation function, giving the deviation as a function of all or some of the primary parameters (execution of the direct model) or secondary parameters (execution of the secondary model), whether they are input or output parameters.

The measurements, whether they are used to obtain certain functional data or they relate to the output parameters to obtain the measurement values to be compared to the theoretical values, are then also obtained in the form of temporal series. Instead of using them in the raw state, they are preferably made to undergo a smoothing before they are compared with the theoretical values. Thus, the deviation functions are themselves automatically smoothed.

In an initialization step at the start of the implementation of a scenario, certain functional data may be difficult to access. Such is typically the case with consumption data. For example, concerning a water distribution network, it is difficult to know the hour-by-hour consumption fed by the network or by each sub-network of this network. According to the invention, provision is made to replace such data that is difficult to access in real time with data that is historically known or known from experience. For example, from previous studies, the estimated consumption of a given sub-network is known at each hour of the day and of the night, together with information on the uncertainty of these values. It is possible, at least at the initialization stage, to use these temporal series as functional data.

Certain structural or functional data may be unknown or uncertain. For example, in a water distribution network, the altitude of the pressure measurement points is important, since each additional meter of altitude corresponds to a pressure drop of approximately 10 kPa, which must be taken into account for the results obtained with the equations governing flow dynamics to be fair. Pipeline diameters, pipeline roughnesses, and other parameters influencing the head losses in the flow, may be insufficiently known, notably in old installations.

Notably, for such a case, it may be wise, during an initialization step, to use an inverse model to determine certain structural or operational data that are impossible or difficult to obtain directly, the inverse model being executed by taking for granted the values of certain primary output parameters, according to the values known or measured for these parameters.

According to an important aspect of the invention, in the execution of the direct model, calculations of sensitivity of at least some of the primary output parameters to the variations of at least some of the other parameters are incorporated, and, for the inverse model, primary input parameters to which the primary output parameter exhibiting the anomaly is more particularly sensitive are chosen as secondary output parameters.

The sensitivity can be obtained theoretically as the derivative of a parameter relative to each of the others, knowing the laws which link these parameters together, or even experimentally by comparing the variations of the measurement of the output parameter with the variations of the other parameters for all the values of the series. The sensitivity may be different in different ranges of values of the parameter for which the sensitivity is assessed, and in different ranges of values of the parameter relative to which the sensitivity is assessed. The sensitivity can then be expressed as a function or as a table of values. The sensitivity may be positive or negative, depending on whether the output parameter changes in the same direction as, or respectively in the inverse direction of, the parameter relative to which the sensitivity of the output parameter is calculated.

In a preferred implementation:
by the direct model, a function of deviation of the value of the deviation between theoretical value and measurement for the abnormal primary output parameter is obtained as a function of the secondary output parameters;

the gradient of the deviation function relative to the parameters is calculated according to the sensitivities;

by the application of the inverse model, a set of new data is determined, modifying the initial data, and for which the overall gradient of the deviation function exhibits a zero value, indicative of positive and negative sensitivities which are neutralized relative to the parameters;

from these parameters, a subset is selected that is formed from those for which the sensitivity is of the same sign;

the method is recommenced iteratively by restricting the secondary output parameters to those forming part of the subset;

and so on until the anomaly is located with a single parameter or a small number of parameters.

To form the subset, preference is given to choosing the sign of sensitivity corresponding to the parameters most likely implicated, according to their nature, the realistic value which would result from a variation in the direction bringing the abnormal theoretical value towards the corresponding measurement value.

Typically, when a single primary output parameter exhibits an anomaly of the measured value relative to the theoretical value, preference is given to the assumption of a measurement error, above all if the parameter exhibiting the anomaly is linked to the topographic limits of the network only through other measurement points. In this case, it is possible to begin by checking the measuring apparatus before applying the inverse model. However, the inverse model can be applied iteratively to conclude on the measurement error by confirming that no combination of values is plausible for the other parameters if the abnormal measurement is taken as assumption. If the measurement originates from a measurement point at the network limit, the anomaly is more likely to originate from an exceptional element beyond the topographic limits of the network. For example, a consumer injects well water into the network, instead of taking water supplied by the network. The operational data on the consumption points must then perhaps be questioned.

In a sophisticated implementation, the direct model and the comparison of the theoretical and measured values are executed cyclically, and the execution of the inverse model is automatically activated when at least two primary output parameters exhibit an anomaly of the measured value relative to the theoretical value.

Preferably, the model elements further comprise indications of uncertainties on the data and the parameters, and, during the comparison, these uncertainties are taken into account to consider an output parameter measurement as being conformal or, on the contrary, abnormal.

BRIEF DESCRIPTION OF THE DRAWINGS

In the following the invention will be described in greater detail with reference to exemplary embodiments in accordance with the accompanying drawings, in which.

DESCRIPTION OF EMBODIMENTS

Other particular features and advantages of the invention will further emerge from the following description, relating to nonlimiting examples concerning a drinking water distribution network, also called "hydraulic network".

Preliminary Observation

The following description serves as a description of any particular feature that it contains, whether it is taken in isolation from the other particular features, even if they form part of the same paragraph or of the same sentence, and serves as a description of any combination of such particular features, when such a particular feature or combination of particular features is distinctive from the prior art and offers a technical effect, whether alone or in combination with concepts presented above, and this particular feature is expressed in the very terms of this description or in more or less generalized terms.

Vocabulary

The following vocabulary is used:

Temporal series: finite sequence of scalar data indexed by time, generally spaced apart by a constant duration.

Hydraulic model: unless otherwise specified, describes the hydraulic model of a drinking water transport and/or distribution network: set of data describing the topology (graph of the network), the topography (altitude), the characteristics of the sections defining their hydraulic behaviour (length, internal diameter, material and/or roughness, singular head loss coefficient, singularities, etc.), the characteristics of the equipment defining their hydraulic behaviour (diameter, head loss coefficient, setpoint value, pump curve, etc.), nominal consumptions associated with the nodes of the graph, and a scenario describing the operating conditions.

Scenario: set of situational or operational data describing the conditions at the limits used with a hydraulic model to simulate the behaviour of a hydraulic system in particular conditions, such as the initial levels of the tanks, the temporal series of modulation of the consumptions by sector and/or by consumer type, the states of the pumps, valves, controlled active equipment setpoints and/or the servocontrol rules.

Measurement: temporal series derived from a data acquisition system. A measurement is associated with a particular individual component of the hydraulic model (arc or section for a flow rate measurement, node for a pressure measurement, tank for a level measurement).

Direct model: the simulation of the hydraulic model consists in numerically resolving the equations of stationary flow described and parameterized by the hydraulic model, and its dynamic evolution, by using the conditions at the limits described in the scenario. The results are flow rates, velocities, head losses, states, pressures at any point of the system and at any instant, these results being usually presented in the form of temporal series or in map form.

Inverse model: (resolving of the inverse problem) consists in numerically resolving the equations of stationary flow and their evolution in time. They are described and parameterized by the hydraulic model and a scenario, relative to one or more parameters of the model or of the scenario, by using the measurements of certain flow rates (or velocity), and/or pressures and/or tank levels.

Remote reading data: consumption index series for a meter, measured with a periodicity of 1 to 24 hours, and remotely transmitted generally at least once a day.

Characteristic: scalar value or temporal series containing meaningful information for the process studied.

General

The implementation of the method according to the invention jointly uses operational data obtained from a remote monitoring system, making it possible to construct a scenario, a hydraulic model of the system of the hydraulic network, and a system for analyzing the results of the execution of the model.

The hydraulic modelling program incorporates an explicit calculation of the sensitivities of the results (measurements) relative to the input data (consumptions at the nodes and hydraulic resistances at the arcs), making it possible to calculate the gradient of the simulation error relative to the parameters, then the resolving of the inverse problem.

The use of the inverse model also makes it possible to mitigate the absence of certain measurements necessary in the construction of a scenario.

The use of the direct model makes it possible to detect system behaviour anomalies.

The use of the inverse model makes it possible to locate, in space and possibly in time, the possible origin of the anomaly.

The optional use of remote reading data makes it possible to bring up to date the spatial distribution of the consumptions described in the hydraulic model.

DETAILED DESCRIPTION

Figure 1:
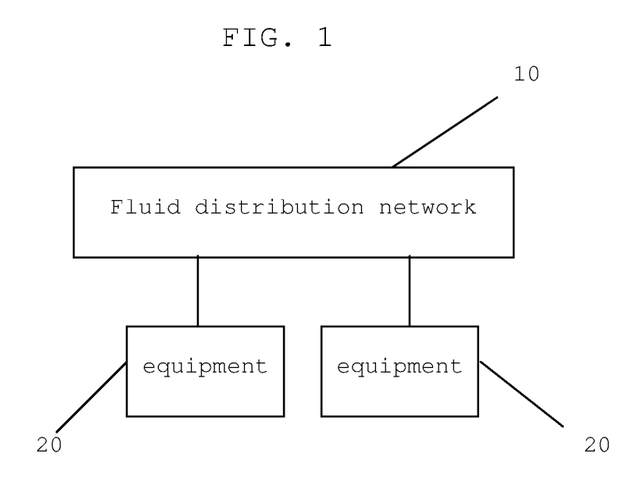
FIG. 1 illustrates a schematic view of one or more embodiments of the present invention.

In accordance with FIG. 1, the elements which are supplied as input for the execution of the direct model, the comparison with the measurements of the primary output parameters, and, if appropriate, the execution of the inverse model, comprise:
  the structural data of the fluid distribution network 10, which can comprise setpoints and status data for the equipment 20 of the fluid distribution network 10;
  the parameters selected to constitute the primary input parameters, and the temporal series of their scalar values, obtained by measurement or by remote reading data available for all or some of the subscribers, or even by existing statistics;
  the parameters selected to constitute the primary output parameters and the temporal series of the measurements of these parameters;
  information on the accuracy and the uncertainties of the measurements and of the parameters, their relative weightings, the activation of the parameters selected to be secondary input parameters and secondary output parameters during the resolving of the inverse problem.

Individual Operations

Construction of the Scenario from the Measurements and Series of States

Figure 2:
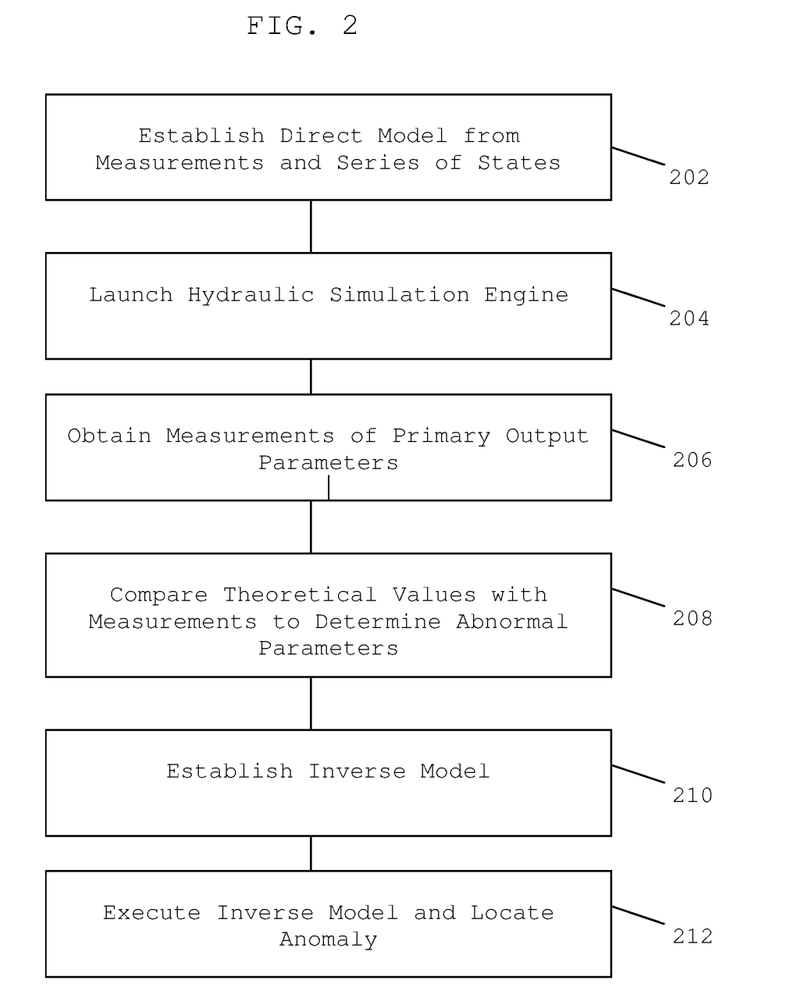
FIG. 2 illustrates a flow chart of one or more embodiments of the present invention.

In accordance with FIG. 2, this operation 202 consists in transcribing the measurements into a form that can be used by the hydraulic modelling software in order to establish the direct model. For example, the algebraic sum of the temporal series of input/output flow rates of a hydraulic sector is converted into modulation series for the nominal consumptions of the sector.

Resolving of the Direct Problem, Calculation of the Characteristics

This operation 204 consists in launching the hydraulic simulation engine, with, as input data, the hydraulic model of the system and the scenario created by the preceding operation 202. The outputs used are the simulated temporal series (theoretical values of the primary output parameters) comparable in operation 208 to measurements available for these parameters obtained in operation 206.

Calculation of the Characteristics

For each measurement point (primary output parameter), the characteristic is calculated on the basis of the series of the residual values, defined as the difference between simulated value (theoretical value) and measured value (smoothed or not), calculated at the acquisition step of the measurement. The characteristic indicates whether there is or is not an anomaly.

Resolving of the Inverse Problem (General Case)

The resolving of the inverse problem is an iterative operation 210 which consists in minimizing, using an optimization algorithm, a function of deviation between measurement and simulation (theoretical value) at the measurement point (algorithm operating by the sum-of-the-squares method or the method of the absolute values of the series of residual values), relative to a configurable set of parameters. In the deviation function, each point of each series is weighted by a coefficient, calculated from the a priori uncertainty and from the local empirical variance of the measurements.

The calculation is done by using date-stamped measurements in a predetermined time window (for example, of 4 to 24 hours).

Each iteration of the minimization problem requires the calculation of the deviation function by relying on the calculation of the direct problem. The optimization method used involves the calculation of the gradient of the deviation function relative to the parameters. The value of this gradient is calculated explicitly from the sensitivities (derivatives) of the measurements relative to the parameters of the hydraulic model, which is executed explicitly in a manner nested with the resolving of the direct problem.

One of the aspects of the innovation is, on the one hand, the explicit calculation of the sensitivities at the same time as the resolving of the direct problem, and their use to calculate the gradient; on the other hand, the possibility of choosing the parameters relative to which the inverse problem is resolved, for example:
  Structural data (hydraulic characteristics of the sections and equipment such as the roughness or the singular head loss coefficients (PCS))
  Dimension (altitude) of the pressure and/or level sensors
  Spatial distribution of the consumptions
  Temporal modulation of one or more consumption types of predefined spatial distribution.

Another important element of the innovation lies in the use of the sensitivities to locate the anomaly, when the identified parameter is associated with a number of components of the model. In this case, when the solution is obtained, the sensitivities take positive values for certain components, negative values for others, because the overall gradient takes a zero value at the optimum. It is then sufficient to repeat the method by resolving, relative to one of the two subsets of components whose gradient is of the same sign, to determine location of the anomaly. The duly formed sequence of nested subsets of components locates the anomaly with increasing accuracy.

The accuracy of the locating is all the greater when the density of measurements is great and their placement is shrewd for the determination of the selected parameter type.

Inverse Problem Applied to the Reconstruction of an Essential Measurement During an Initialization Step When a measurement essential to the construction of a scenario (for example an input or output flow rate of a sector) is unavailable, the resolving of the inverse model makes it possible to reconstruct this missing measurement, provided that certain conditions of observability are met, in this case that other measurements exist whose values are related to the missing measurement (for example, tank level and/or pressure measurements).

An initial scenario is then constructed by using a predetermined series, and the inverse problem is resolved relative to the parameter consisting of the missing series.

Execution of the Inverse Model (Operation 212) Applied to the Detection of Anomalies Applied to the identification of structural data such as roughnesses or PCS (singular head loss), the resolving of the inverse problem (execution of the inverse model) makes it possible to adjust the hydraulic model, to identify hydraulic resistance anomalies such as diameter or pipe length input errors and to locate closed values forgotten after an intervention.

Applied to the identification of structural parameters such as the altitudes of the sensors or the equipment setpoints, the resolving of the inverse problem makes it possible to diagnose losses of representativeness of the hydraulic model after an intervention which has resulted in the modification of one of the parameters of the network.

Applied to the identification of the spatial distribution of the consumptions or the series of the modulation coefficients of one or more types of consumers, the resolving of the inverse problem makes it possible to locate the consumption anomalies. The deviation of each parameter between its theoretical and measurement values constitutes a quantitative indicator or a characteristic that can be used for the detection of anomalies.

Interpretation of the Characteristics and Anomalies

Conformity indicators: for each characteristic, one or more quantitative indicators is/are calculated: Nash criterion, "Index of Agreement", rate of overshoot of an error threshold.

Anomalies: for each measurement, a qualitative indicator is calculated (good/fairly good/mediocre/poor) based on the position of its conformity indicators relative to operationally set thresholds. The values ranked as "mediocre" or "poor" are identified as anomalies.

An isolated anomaly in a sector is ranked "measurement anomaly"; the observation of several anomalies on a sector triggers a "network anomaly".

Advantages

The assembly consisting of the components explained above can be connected to the technical information system of the operator of a drinking water supply system. The assembly is constructed in such a way that it can be activated regularly, with a frequency of between the frequency of acquisition of the measured data and once a day. In these conditions, the detection and the characterization of the anomaly are much faster than with the methods usually used and the operational effectiveness thereof is considerably improved.

In the phase of deployment of a hydraulic model for a network, the invention makes it possible to greatly reduce the model adjustment time.

First Exemplary Embodiment

The invention is configured to model a hydraulic sector fed by gravity by two tanks of head A and B.

The hydraulic model consists of a file in the PICCOLO/GANESSA_SIM format.

The scenario generator used is GANESSA_GS.

The hydraulic simulation engine incorporating the direct or inverse problem solving (model execution) is GANESSA_SIM.

The elements feeding the model are the input flow rate of each tank, the level of each tank, the output flow rates of each tank and the pressure at a remote point, at the frequency of once a day. The output flowmeter of the tank A exhibits an anomaly consisting in undermetering by approximately 10%.

The direct hydraulic modelling over 24 hours produces, among other things, the aggregate of the algebraic sum of the input and output flow rates of the tanks. The "calculated level minus measured level" characteristic gives information on the fairness of the flow rate measurements, a positive deviation at period end indicating an undermetering of the output flow rates, or an overmetering of the input flow rates. The indicator calculated from this characteristic reveals an anomaly; the sign of the characteristic for each of the output flow rate measurements indicates the direction of the anomaly.

The inverse model configured with, as secondary output parameters, an additional consumption set at the output point of each tank and a temporal series of coefficients, calculates the adjustment of the two intensity series for each tank output point. The series associated with the output point of the tank A exhibits a profile proportional to the output flow rate of A, corresponding to a consumption of the order of 10%, whereas the series associated with B exhibits negligible intensities.

Second Example

The invention is configured to model a hydraulic sector fed by a master pipeline at two points A and B.

The hydraulic model consists of a file in the EPANET format.

The scenario generator used is GANESSA_GS.

The hydraulic simulation engine incorporating the resolving of the inverse problem is GANESSA_SIM.

The measurements are the input flow rates and pressures (points A and B), and the pressure measurements obtained at six additional points distributed over the distribution network.

Initially, the invention has been used offline to adjust the hydraulic setting of the model: the inverse model made it possible to identify the precise altitude of the pressure measurement points, the hydraulic resistance of the two input valves, and the average roughness of the four main classes of materials of which the sector pipelines are constructed.

Secondly, the invention is implemented with a daily frequency. A low additional consumption (for example 1 l/s) is distributed over all of the nodes of the model, for example pro rata to the pipe lengths which are connected to them, and assigned a particular consumer code (for example "LEAK"), and a temporal series is associated with this "LEAK" code, initialized with zero or unitary values. The inverse problem is then resolved relative to the coefficients of the temporal series of the "LEAK" coefficients. The corresponding characteristic is then analyzed: if the corresponding consumption is below a predetermined threshold, then the situation is considered as normal. Otherwise, a consumption anomaly is presumed. The invention is then once again implemented after having reallocated the additional consumption only to nodes for which the sensitivity calculated in the preceding step is negative, and done so with several repeats, until the number of nodes remaining is below a predetermined threshold. The last sets of corresponding nodes are then reported as location of the anomaly, and the average value of the additional consumption (associated with "LEAK"), as its intensity.

Obviously, the invention is not limited to the examples described.

The invention claimed is:

1. A method for detecting anomalies in a fluid distribution network, the method comprising:
    establishing, for the distribution network, a direct model comprising:
        structural data of the distribution network relative to the topography of said distribution network and comprising setpoints or status data of equipment of said distribution network,
        operational data relative to parameters chosen as primary input parameters describing an operational scenario, and
        laws linking said structural data, the primary input parameters, and primary output parameters;
    executing the direct model by a hydraulic simulation engine to determine theoretical values of the primary output parameters;
    obtaining measurements from data acquisition systems of the primary output parameters;
    comparing the theoretical values with the measurements;
    when the comparing reveals at least one of the primary output parameters that is abnormal because of at least one significant deviation between at least one of the theoretical values and at least one of the measurements, establishing an inverse model comprising a minimization of a function of a deviation between measurement and simulation at a measurement point, relative to a configurable set of parameters, the inverse model being derived from the direct model by introducing the at least one abnormal primary output parameter as a secondary input parameter of the inverse model, the secondary input parameter taking the measurement as a value, the inverse model comprising at least one secondary output parameter in addition to the primary output parameters which are retained;
    executing the inverse model by the hydraulic simulation engine; and
    locating an anomaly of the distribution network from the execution of the inverse model.

2. The method according to claim 1, wherein the at least one secondary output parameter is a parameter added to the inverse model, relative to the direct model.

3. The method according to claim 1, wherein the at least one secondary output parameter corresponds to at least one deleted datum, relative to the direct model.

4. The method according to claim 1, wherein the at least one secondary output parameter is selected by applying criteria indicating a likelihood that at least one new secondary output parameter is implicated in the at least one deviation observed between the at least one measurement and the at least one theoretical value.

5. The method according to claim 1, wherein at least some of the operational data, the theoretical values, and the measurements comprise temporal series that is a series of values each associated with a schedule.

6. The method according to claim 5, wherein the temporal series formed from values obtained from the measurements are smoothed following a configurable characteristic duration.

7. The method according to claim 1, wherein, in an initialization step, an inverse model is used to determine certain structural or operational data that are impossible or difficult to obtain directly, the inverse model being executed by omitting values of certain primary output parameters.

8. The method according to claim 1, wherein, in the execution of the direct model, calculations of sensitivity of at least some of the primary output parameters to the variations of at least some of the other parameters are incorporated, and
    for the inverse model, primary input parameters to which the abnormal primary output parameter is more particularly sensitive are chosen as secondary output parameters.

9. The method according to claim 8, further comprising:
    obtaining, by the direct model, a deviation function of the value of the at least one deviation between the at least one theoretical value and the at least one measurement for the abnormal primary output parameter, as a function of the secondary output parameters;
    calculating the gradient of the deviation function relative to the parameters according to the sensitivities;
    determining, by application of the inverse model, a set of new data, modifying the initial data, and neutralizing positive and negative sensitivities for which the overall gradient of the deviation function exhibits a zero value;
    from the parameters relative to which the sensitivities are calculated, selecting a subset of parameters that is formed from the parameters for which the sensitivity is of the same sign;
    iteratively restricting the secondary output parameters to the parameters forming part of the subset until the anomaly is located with a single parameter or a small number of parameters.

10. The method according to claim 1, wherein when a single primary output parameter exhibits an anomaly of the measured value relative to the theoretical value, a measurement error is determined.

11. The method according to claim 1, wherein the direct model and the comparison of the theoretical and measured values are executed cyclically, and
    wherein the execution of the inverse model is automatically activated when at least two primary output parameters exhibit an anomaly of the measured value relative to the theoretical value.

12. The method according to claim 1, wherein the model elements further comprise indications of uncertainties on the data and the parameters, and
    during the comparison, the uncertainties are taken into account to consider an output parameter measurement as being conformal or abnormal.

13. The method according to claim 1, further comprising improving a performance level of the distribution network.

14. The method according to claim 2, wherein the at least one secondary output parameter corresponds to at least one deleted datum, relative to the direct model.

15. The method according to claim 2, wherein the at least one secondary output parameter is selected by applying criteria indicating a likelihood that at least one new secondary output parameter is implicated in the at least one deviation observed between the at least one measurement and the at least one theoretical value.

16. The method according to claim 3, wherein the at least one secondary output parameter is selected by applying criteria indicating a likelihood that at least one new secondary output parameter is implicated in the at least one deviation observed between the at least one measurement and the at least one theoretical value.

17. The method according to claim 2, wherein at least some of the operational data, the theoretical values, and the measurements comprise temporal series that is a series of values each associated with a schedule.

18. The method according to claim 3, wherein at least some of the operational data, the theoretical values, and the measurements comprise temporal series that is a series of values each associated with a schedule.

19. The method according to claim 4, wherein at least some of the operational data, the theoretical values, and the measurements comprise temporal series that is a series of values each associated with a schedule.

20. The method according to claim 2, wherein, in an initialization step, an inverse model is used to determine certain structural or operational data that are impossible or difficult to obtain directly, the inverse model being executed by omitting values of certain primary output parameters.

\* \* \* \* \*